United States Patent
Onishi et al.

(10) Patent No.: US 7,928,573 B2
(45) Date of Patent: Apr. 19, 2011

(54) METAL THIN FILM FOR INTERCONNECTION OF SEMICONDUCTOR DEVICE

(75) Inventors: Takashi Onishi, Kobe (JP); Masao Mizuno, Kobe (JP); Mikako Takeda, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 1006 days.

(21) Appl. No.: 11/465,626

(22) Filed: Aug. 18, 2006

(65) Prior Publication Data

US 2007/0145586 A1 Jun. 28, 2007

(30) Foreign Application Priority Data

Dec. 27, 2005 (JP) ................. 2005-375237

(51) Int. Cl.
*H01L 23/48* (2006.01)
(52) U.S. Cl. ................ 257/762; 257/741; 257/E21.169; 438/687
(58) Field of Classification Search .................. 257/762, 257/E21.169, 741
See application file for complete search history.

(56) References Cited

U.S. PATENT DOCUMENTS

| | | | |
|---|---|---|---|
| 6,090,701 A * | 7/2000 | Hasunuma et al. | 438/632 |
| 6,181,012 B1 * | 1/2001 | Edelstein et al. | 257/762 |
| 6,451,682 B1 | 9/2002 | Fujikawa et al. | |
| 2003/0181032 A1 | 9/2003 | Kawano | |
| 2004/0152334 A1 * | 8/2004 | Ohto et al. | 438/758 |

FOREIGN PATENT DOCUMENTS

| | | |
|---|---|---|
| JP | 5-211238 | 8/1993 |
| JP | 8-88224 | 4/1996 |
| JP | 10-79428 | 3/1998 |
| JP | 2000-200789 | 7/2000 |
| JP | 2001-7050 | 1/2001 |
| JP | 2003-273209 | 9/2003 |

OTHER PUBLICATIONS

Shimooka et al. Apr. 2, 1996. JP Publication 08-088224, Machine English Translation.*

* cited by examiner

*Primary Examiner* — Hung Vu
*Assistant Examiner* — Vernon P Webb
(74) *Attorney, Agent, or Firm* — Oblon, Spivak, McClelland, Maier & Neustadt, L.L.P.

(57) ABSTRACT

A metal thin film used in fabricating a damascene interconnection of a semiconductor device which exhibits excellent high temperature fluidity during high pressure annealing, and which can fabricate an interconnection for a semiconductor device which has a low electric resistance and stable high quality is provided. Also provided is an interconnection for a semiconductor device. More specifically, a metal thin film for use as an interconnection of a semiconductor device comprising a Cu alloy containing N at a content of not less than 0.4 at % to not more than 2.0 at %; and an interconnection for a semiconductor device fabricated by forming the metal thin film on an insulator film which is formed on a semiconductor substrate and which has grooves formed therein, and filling the metal thin film in the interior of the grooves by a high pressure annealing process are provided.

26 Claims, 7 Drawing Sheets

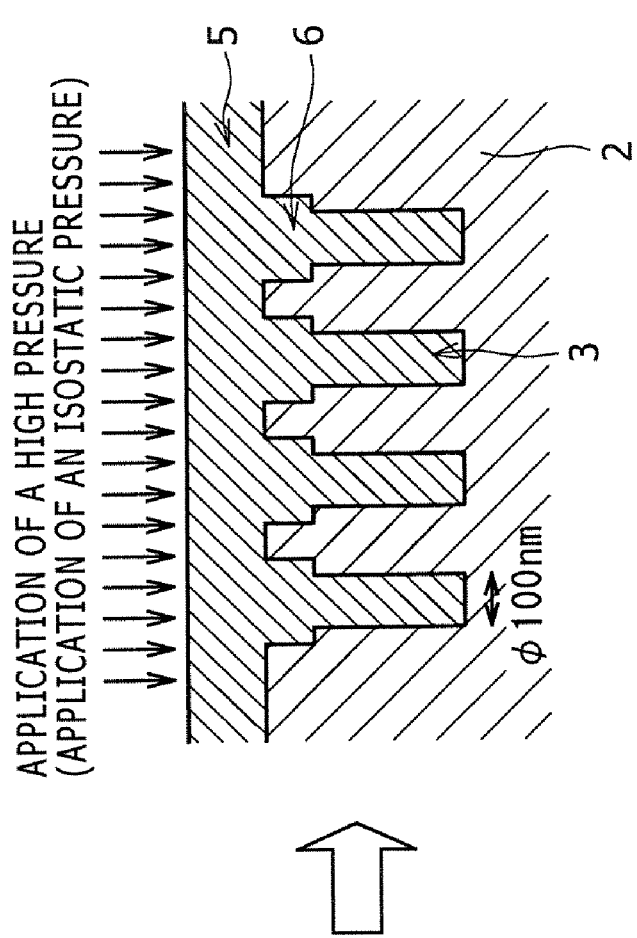
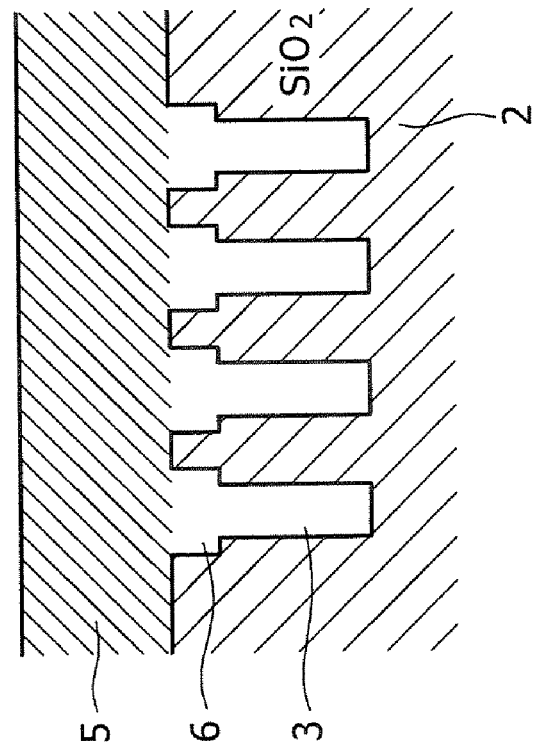

METAL THIN FILM FOR INTERCONNECTION OF SEMICONDUCTOR DEVICE

FIELD OF THE INVENTION

This invention relates to a metal thin film used as an interconnection in a semiconductor device, an interconnection in a semiconductor device, and a method for fabricating such metal thin film or such interconnection. More specifically, this invention relates to a Cu based alloy interconnection used in a semiconductor device such as silicon semiconductor device as typically represented by an ULSI (ultra large-scale integration), a metal thin film used in forming such interconnection, and a method for fabricating such interconnection or such thin film, wherein the interconnection is fabricated by forming a thin film comprising a Cu based alloy (hereinafter sometimes referred to as a Cu based alloy) in a groove such as a via or a trench formed in an insulator film on a semiconductor substrate; and filling the metal by reflowing at a high temperature and a high pressure.

BACKGROUND OF THE INVENTION

In recent years, design rules are increasingly scaled down to meat with the increase in the integration of LSI (large scale integration) and need for high speed signal transmission, and this resulted in the accelerated decrease of the pitch and width of the interconnections and distance between the interconnections. Multi-layer interconnections have also been used to correspond to the need of the high shrinkage of the semiconductor device. The shrinkage and high integrity of the interconnection circuit, however, were associated with an increased electrical resistivity of the interconnection, and since this increase in the interconnection resistance invited slowing of the signal transmission, various attempts are recently made to use an interconnection having a lower electric resistance. One such attempt is use of a Cu based alloy in forming a Cu based alloy interconnection since Cu based alloy interconnection can reduce the electric resistance to a level lower than that of the conventional Al based alloy interconnection.

Damascene process technology has been used in fabricating the multilayer structure of the Cu based interconnection (for example, see Patent Document 1). This method is accomplished by an insulator film of silicon oxide, silicon nitride, or the like on the semiconductor substrate by the method commonly used in the art; forming an interconnection trench or an interlayer connection hole such as a trench or a via hole for embedding the interconnection in the insulator film; depositing a TaN thin film on the interior surface of such trench or the like; forming a seed layer of the Cu thin film; and filling the Cu thin film in the trench or the via hole; and removing the unnecessary interconnection material that has deposited on the part other than the trench or the via hole by chemical mechanical polishing (CMP) to thereby leave the interconnection material only in the interior of the trench or the via hole for use as the interconnection.

In spite of the shrinkage of the LSI interconnection according to the road map, and the resulting decrease in the width of the trench and the diameter of the via hole together with the increase in the aspect ratio (ratio of the pore depth to the pore groove diameter), filling of the metal in such minute groove by conventional electroplating suffered from the technical limit in the filling the metal in the minute groove, and complete filling of the metal in the minute via having a high aspect ratio or the via and the narrow trench having an interconnection width of up to 100 nm has been difficult.

In addition to the complete filling in the groove, the Cu based alloy interconnection is also required to have properties such as low electric resistance ($\rho \leq 3.0$ μΩcm), connection reliability (formation of a reliable contact), and interconnection reliability (resistance to disconnection by stress migration (SM resistance), resistance to disconnection by electromigration (EM resistance), etc.). In order to increase the reliabilities as described above, use of the Cu based alloy interconnection is contemplated in a high performance ULSI device. However, thin films of Cu alloy are difficult to form by electroplating, and a thin film of Cu alloy fulfilling all of such properties is quite difficult to realize.

While formation of the Cu based alloy interconnection by the damascene process is associated with the difficulties as described above, such Cu based alloy interconnection formed by damascene process is finding a wider use in Japan particularly in customer specific IC due to the economic advantage, and the damascene process is conceived to be continuously used as a process of forming the Cu based alloy interconnection. Accordingly, there is a need to develop a technology which can form a Cu based alloy interconnection having a low electric resistance, a high connection reliability, and a high interconnection reliability by the damascene process.

One method that has been proposed as a way to realize complete filling of the Cu based metal in the trench or the via hole is the formation of the Cu based alloy interconnection by CVD (chemical vapor deposition). Such formation of a film by CVD, however, is associated with the problems such as difficulty of forming a film of high purity as well as high cost.

One method effective in solving the problems associated with the electroplating or the CVD is use of sputtering for the film deposition, which is conducted by the sputtering of the Cu based alloy interconnection material followed by reflowing at a high temperature and a high pressure. This reflowing at a high temperature and a high pressure comprises the steps of forming a thin film 5 of a Cu based metal on the surface of an insulator film 2 which is preliminarily formed with a plurality of grooves such as vias (connection holes) 3 or trenches (trenches) 6 by sputtering so that the thin film 5 bridges across the grooves as shown in FIG. 1A; and applying an isotropic pressure in the perpendicular direction to the surface of the thin film (for example, by applying a hydrostatic pressure which is higher than the atmospheric pressure as described in Patent Document 2) as shown in FIG. 1B to thereby force the Cu based metal into the interior of the grooves.

For example, Patent Document 3 proposes formation of an interconnection film by covering the surface of a substrate having deposited thereon an insulator film which is formed with holes or trenches with a metal such as copper, a copper alloy, silver or a silver alloy; and annealing the substrate to thereby fill the holes or the trenches with the metal.

This method still suffers from the problems, for example, that the Cu alloy thin film will not be fully filled in the groove even if the reflowing at a high temperature and a high pressure were carried out if the thin film of Cu alloy formed were not continuous and gas tight, and that the thin film will no longer be filled in the groove once the thin film of the Cu based metal becomes deformed and ruptured. The Cu based thin film formed by sputtering, however, is inferior in reflowability (high temperature flowability) compared to the Cu based thin film formed by electroplating, and improvement of the reflowability during the high-pressure annealing process of the Cu based thin film formed by sputtering has become an important challenge in employing the damascene interconnection technique.

In addition, when the high temperature flowability of the Cu based thin film formed by sputtering is insufficient, or when the Cu based thin film is to be fully filled in a via or a trench having a minute diameter or width and a high aspect ratio, an even higher temperature and pressure are required. However, realization of such temperature and such pressure is difficult under present technology, and even if realization of such conditions were possible, treatment under such high temperature and such pressure is associated with certain danger. Accordingly, filling of the Cu based thin film under a milder condition is highly required.

[Patent Document 1] Japanese Unexamined Patent Application No. H10-79428

[Patent Document 2] Japanese Unexamined Patent Application No. H5-211238

[Patent Document 3] Japanese Unexamined Patent Application No. 2001-7050

SUMMARY OF THE INVENTION

The present invention has been completed in view of the situation as described above, and an object of the present invention is to provide a metal thin film used for interconnection of a semiconductor device, and more specifically, a metal thin film used in providing a Cu based alloy interconnection of damascene structure (embedded type) by "sputtering+high temperature, high pressure reflowing" in the fabrication of a semiconductor device, which enables filling of a Cu based metal in a groove such as connection hole or trench without leaving voids, and which realizes a highly reliable and compact Cu based alloy interconnection exhibiting a high electric resistance and a good adhesion to the insulator film. Another object is to provide an interconnection for a semiconductor device which can be fabricated by using such metal thin film and which has such characteristic features, and a fabrication method which facilitates fabrication of such metal thin film and such interconnection.

The metal thin film used for interconnection of a semiconductor device according to the present invention is a metal thin film for use as an interconnection of a semiconductor device wherein the metal thin film is used in fabricating an embedded interconnection of a semiconductor device by a high pressure annealing process, and the metal thin film comprises a Cu alloy containing N at a content of not less than 0.4 at % to not more than 2.0 at %. The metal thin film exhibiting a residual strength of −400 to −600 MPa is useful in fabricating a highly reliable interconnection for a semiconductor device.

The interconnection for a semiconductor device according to the present invention is fabricated by forming a metal thin film on an insulator film formed on a semiconductor substrate, the insulator film having grooves formed therein; and filling the metal thin film in the interior of the grooves by a high pressure annealing process. The interconnection is preferably the one filled in the groove having its surface covered with a TaN film since the such interconnection enjoy high barrier property as well as good adhesion between the TaN film and the interconnection. The metal thin film is preferably the one exhibiting a residual strength of 0 to +200 MPa since such interconnection has high reliability.

This invention also defines the fabrication method of such metal thin film. In this method, the metal thin film is fabricated by sputtering, and the sputtering gas used is a gas mixture of Ar and $N_2$ having a volume ratio (at 25° C., 1 atm) of Ar to $N_2$ of 97.5:2.5 to 82.5:17.5.

This invention also defines the fabrication method of such interconnection of a semiconductor device. In this method, in forming the metal thin film on an insulator film which is formed on a semiconductor substrate and which has grooves formed therein; and filling the metal thin film in the interior of the grooves by a high-pressure annealing process, the high pressure annealing process is conducted under the conditions including:

Annealing temperature: 200 to 650° C.
External pressure: 50 to 250 MPa.

Use of an insulator film having the grooves covered with a TaN film is preferable because of the improved barrier property and the improved adhesion with the interconnection. In addition, the method as described above is capable of filling the metal thin film in a minute groove having a high aspect ratio as represented by the minimum width of not more than 0.15 μm and the depth of not less than 0.15 μm.

MERIT OF THE INVENTION

The present invention is capable of filling a Cu based metal in a groove such as connection hole or trench without leaving voids in the fabrication of a semiconductor device (for example, a silicon semiconductor device) to thereby readily realize a Cu based alloy interconnection of embedded type which has low electric resistance and stable properties. This contributes for improvement in the integrity and performance of an integrated circuit.

BRIEF DESCRIPTION OF THE DRAWINGS

FIG. 1 is a schematic view illustrating the formation of the interconnection according to the present invention.

DETAILED DESCRIPTION OF THE INVENTION

Figure 2:
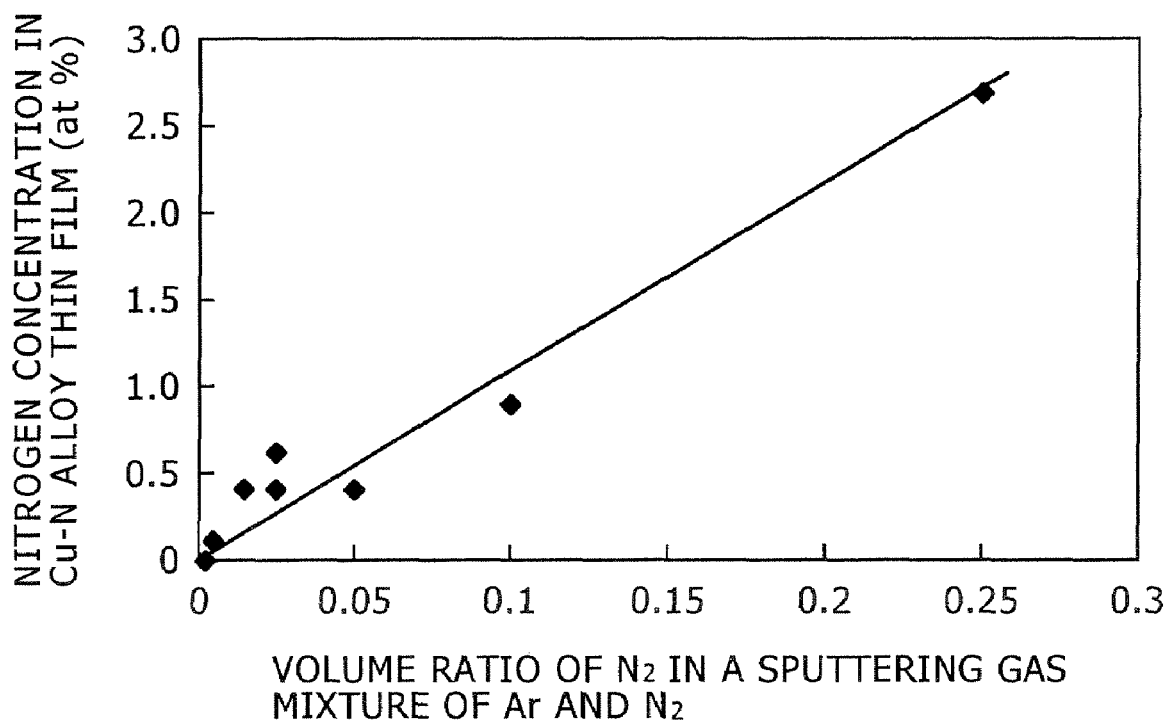
FIG. 2 is a graph showing $N_2$ concentration in the thin film of Cu—N alloy in relation to the volume ratio of $N_2$ in the gas mixture of (Ar+$N_2$) in Example 1.

In forming an interconnection (a damascene interconnection) of a semiconductor device by forming a thin film comprising a Cu based metal on an insulator film which is formed on a semiconductor substrate and which has grooves (such as connection hole or trench) formed therein, and filling the metal thin film in the interior of the grooves by a high pressure annealing process as described above, it is important to improve fluidity of the Cu based metal in the high pressure annealing process.

The inventors of the present invention found that, in order to improve fluidity of the Cu based metal in the high pressure annealing process and realize an interconnection having a low electric resistance and improved connection reliability (formation or a reliable contact) and interconnection reliability (SM resistance, EM resistance, etc.), a thin film of a Cu—N based alloy having nitrogen content within a fixed range should be formed as a metal thin film after the sputtering and before the high pressure annealing process, namely, in the as-deposited state (hereinafter sometimes simply referred to as "metal thin film"), and such Cu—N based alloy thin film can be formed by using a gas mixture of Ar and $N_2$ of fixed formulation for the sputtering gas of the sputtering; that an interconnection having the properties as described can be fabricated from the thin film of a Cu—N based alloy by conducting the high pressure annealing process under the controlled conditions. The present invention is described in detail in the following.

In the case of a metal wherein the crystal grains are fine in the as-deposited state and experience marked growth in the heat treatment, rapid atom diffusion in the course of the crystal grain growth results in the high temperature fluidity (high temperature reflowability). In addition, when the crystal grains are fine in the as-deposited state, grain boundary sliding takes place in the high temperature range to realize the high temperature fluidity. In the case of pure copper thin film, grain growth takes place in the as-deposited state, and the average crystal grain size becomes equivalent with the film thickness, and accordingly, high temperature flowability is not realized. On the other hand, in the case of the thin film comprising a Cu alloy having an alloying element such as Mg added thereto, in spite of the small crystal grain size in the as-deposited state, solid solution is strong to detract from the crystal grain growth in the heat treatment, and fluidity is less likely to become evident.

In contrast, in the case of a Cu alloy thin film which has been formed by introducing $N_2$ gas during the film formation by sputtering and having nitrogen forcedly incorporated as solid solution, the film was found to have a high temperature flowability because the fine crystal grain size in the as-deposited state is realized simultaneously with the marked crystal grain growth in the heat treatment. Such behavior of the Cu—N based alloy thin film in the crystal grain growth is believed to have been caused by the rapid change in the residual stress by the release of $N_2$ gas during the heating process.

In order to fabricate a Cu—N based alloy thin film which exhibits such advantages, content of the nitrogen in the thin film should be controlled to the range of not less than 0.4 at % and not more than 2.0 at %. The lower limit of the nitrogen concentration is set in view of sufficiently improving the high temperature flowability. In view of suppressing SM (stress migration) of the interconnection for a semiconductor device, tensile stress applied to the interconnection is preferably as low as 0 to +200 MPa (a positive stress with a smaller absolute value). In order to fabricate an interconnection having such stress in the high pressure annealing process, Cu—N based alloy thin film preferably has a stress as low as −400 to −600 MPa (a negative stress with a larger absolute value), and the nitrogen concentration in the Cu alloy thin film should be increased to not less than 0.4 at % to fabricate a metal thin film having such a stress.

On the other hand, when the nitrogen content exceeds 2.0 at %, toughness and viscosity of the metal thin film will be insufficient, and formation of the film having a uniform thickness will be difficult. The content is preferably up to 1.0 at %.

When such Cu—N based alloy thin film is used, $N_2$ gas is released during the high pressure annealing temperature, and the thus induced increase of the defects (point defects, cluster lattice vacancy defect, etc.) in the film will also invite increase in the flowability at a high temperature. Bulk copper has defects at an amount corresponding to the amount of vacancy in thermal equilibrium state, and the copper thin film formed by the electrolytic method has even larger number of vacancy and the amount of the lattice vacancy reaches thermal equilibrium near the melting point of the bulk copper. However, the copper thin film formed by sputtering has such lattice vacancy defects at a lower amount compared to the copper thin film formed by electrolytic method, and this invites decrease in the high temperature flowability. However, in the case of the Cu—N based alloy thin film, $N_2$ gas is released at approximately 200° C. which is before reaching the temperature range of recovery (300 to 500° C.), and the defects (point defect, cluster lattice vacancy defect, etc.) in the film increases by such release of the $N_2$ gas, and such presence of the defects invites violent atom diffusion at the temperature range of recovery (300 to 500° C.) to promote softening and deformation of the copper. This is conceived to increase the high temperature flowability.

When the Cu—N based alloy thin film of the present invention is subjected to a heat temperature, the nitrogen that has been present as a solid solution in the thin film is released and removed as nitrogen gas, and the electric resistance of the interconnection after the heat treatment is reduced to the level equivalent to the low electric resistance of the pure copper.

The thin film of the Cu—N based alloy is preferably formed to a thickness of not less than 100 nm and not more than 2 μm. When the film thickness is less than 100 nm, uniform coverage of the hole or trench surface is difficult. On the other hand, the film having a thickness in excess of 2 μm is too thick, and such film is difficult to fill in the groove even when a high pressure is applied.

The thin film of the Cu—N based alloy of the present invention may be a thin film of the Cu—N alloy containing the predetermined amount of nitrogen and the residue of copper and inevitable impurities, or a thin film containing such amount of nitrogen, up to 2.0 at % in total of an element which does not inhibit high temperature flowability too much such as Mg, Al, Si, P, S, Ti, V, Cr, Mn, Fe, Co, Ni, Zn, Ge, Y, Zr, Nb, Mo, Tc, Ru, Rh, Pd, Ag, Cd, In, Sn, Sb, Hf, Ta, W, Re, Os, Ir, Pt, Au, Pb, Bi, and a rare earth metal element (a lanthanoid series element of atomic number 57 to 71), and the residue of Cu and inevitable impurity.

Since formation of such thin film of the Cu—N based alloy is either impossible or difficult by electroplating and CVD, such film should be formed by sputtering. To enable such formation of the Cu based film by sputtering, use of a gas mixture (Ar+$N_2$) of particular formulation is very effective.

More specifically, concentration of the nitrogen in the Cu—N based alloy thin film is determined by the mixing ratio of the gas mixture (Ar+$N_2$) used for the sputtering, and the volume ratio (25° C., 1 atm) of Ar and $N_2$ in the gas mixture (Ar+$N_2$) should be in the range of 97.5:2.5 to 82.5:17.5. More preferably, the volume ratio of Ar and $N_2$ is in the range of 97.5:2.5 to 93.75:6.25.

The gas pressure used in the sputtering may be in the range of $1\times10^{-3}$ to $1\times10^{-4}$ Torr which is the typical gas pressure used in the DC magnetron sputtering.

When the thin film of the Cu—N based alloy as described above is formed by sputtering on the insulator film which is formed on the substrate and which has the grooves (such as connection hole or trench); and the thin film of the Cu—N based alloy is fully filled in the grooves of the insulator film by a high pressure annealing to form an interconnection (a damascene interconnection) of a semiconductor device, the high pressure annealing is preferably conducted under the following conditions.

[Treatment temperature: 200° C. to 650° C.] In view of improving the high temperature flowability of the Cu—N based alloy, the temperature of the high pressure annealing should be at least 200° C., and preferably at least 250° C. On the other hand, the temperature of the high pressure annealing should not exceed 650° C., and the temperature is preferably up to 500° C. since the treatment at an excessively high temperature may invite breakdown or deterioration of other components of the semiconductor device such as the barrier film and the dielectric layer.

[Treatment pressure: 50 to 250 MPa] In view of improving the high temperature flowability of the Cu—N based alloy, the pressure of the high pressure annealing should be at least 50 MPa, and preferably at least 70 MPa. On the other hand, the pressure of the high pressure annealing should not exceed 250 MPa, and the pressure is preferably up to 210 MPa since an excessively high pressure may invite breakdown or deterioration of other components of the semiconductor device as in the case of the excessively high temperature.

The annealing time is preferably in the range of 15 to 120 minutes.

The grooves formed in the insulator film on the semiconductor substrate is preferably coated on its surface with a TaN film, since provision of such TaN film prevents copper diffusion in the insulator film and the resulting semiconductor device will enjoy good adhesion of the interconnection with the groove. The method used in the formation of such TaN film is not particularly limited, and the TaN film may be formed, for example, by sputtering (such as DC magnetron sputtering) or CVD.

When the grooves (such as connection hole or trench) are minute, and the grooves are narrow and deep with a large aspect ratio, filling of the grooves with the metal is difficult, and the metal is required to have a higher high temperature flowability. However, when the thin film of the Cu—N based alloy is formed, and the high pressure annealing process is carried out under the conditions as described above by employing the method of the present invention, the thin film of the Cu—N based alloy can be filled in the fine grooves with a high aspect ratio formed in the insulator film such as those having a minimum width of up to 0.15 μm (or even narrower grooves with the minimum width of up to 0.10 μm, or up to 0.07 μm) and a depth of at least 0.15 μm (or even deeper grooves with the depth of at least 0.7 μm, or at least 1.0 μm, or as deep as at least 1.5 μm) (the width and the depth are those of the grooves before forming the barrier film, or the like).

The interconnection for a semiconductor device fabricated by forming the thin film of the Cu—N based alloy as described above and conducting the high pressure annealing process under the conditions as described above has a stress of 0 to +200 MPa which is smaller than the stress of the conventional Cu based thin film, and the interconnection exhibits a suppressed SM. In addition, since the nitrogen that has been present as a solid solution in the thin film of the Cu—N alloy is released and removed as nitrogen gas in the course of the high-pressure annealing process, the electric resistance of the resulting interconnection for a semiconductor device is reduced to the level substantially equivalent to the low electric resistance of the pure copper.

EXAMPLES

Next, the present invention is described in further detail by referring to the Examples, which by no means limit the scope of the present invention. Any modification consistent with the description hereinabove or hereinbelow is within the scope of the present invention.

Example 1

Thin films of pure copper and Cu—N alloys were formed to a thickness of 1 μm on a glass substrate having a diameter of 2 inches by DC magnetron sputtering. The sputtering was conducted using pure Cu (purity, 4N) for the sputtering target and a gas mixture of ($Ar+N_2$) by varying $N_2$ volume ratio under the following conditions.

Ultimate vacuum: $1\times10^{-6}$ Torr or less
Type of the sputtering gas: $Ar+N_2$
Sputtering gas pressure: $2\times10^{-3}$ Torr
Density of discharge power: 3.2 W/cm$^2$ (DC)
Substrate temperature (Ts): RT
Distance between cathode and substrate: 55 mm The thus formed thin films were quantitatively analyzed for their components (Cu, N) by ICP spectrometry for Cu, and by distillation fractionation followed by indophenol absorptiometry for N.

The results of the experiment as described above are shown in FIG. 2 wherein the nitrogen concentration in the thin film is shown in relation to the composition of the sputtering gas [volume ratio of $N_2$ in the gas mixture of ($Ar+N_2$)]. As shown in FIG. 2, the nitrogen concentration in the thin film is inclined to increase with the increase in the volume ratio of $N_2$ in the gas mixture of ($Ar+N_2$). In addition, the nitrogen concentration in the thin film was highly correlated with the volume ratio of $N_2$ in the gas mixture of ($Ar+N_2$), and it was indicated that a Cu—N based alloy thin film having a predetermined nitrogen could be formed by controlling the volume ratio of $N_2$ in the gas mixture of ($Ar+N_2$).

Example 2

An experiment showing the formation of the interconnection in a semiconductor device was conducted by the scheme shown in the schematic cross sections of FIG. 3. First, as schematically shown in FIG. 3A, an insulator film (TEOS film: SiOF film) 2 formed on a silicon wafer 1 was provided. This insulator film 2 had formed therein a large number of vias 3 each having a diameter of 0.12 μm and a depth of 0.55 μm at a pitch of 450 nm (only one via shown in FIG. 3A). This structure was used for evaluation as a test structure (also referred as TEG (test element group) chip). On the surface of this test structure was formed a TaN thin film by reactive sputtering using a pure Ta target in a gas mixture of ($Ar+N_2$). A barrier layer (TaN thin film) 4 having a thickness of 50 nm was thereby formed on the bottom and side of the via 3 (FIG. 3B).

Figure 3A:
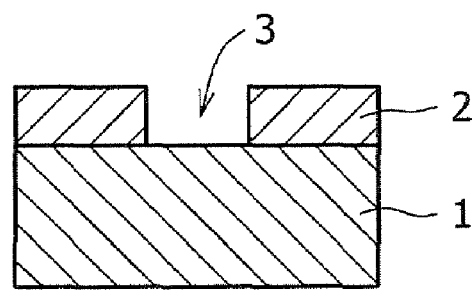
FIG. 3 is a schematic cross-sectional view illustrating the formation of a part of a semiconductor device in sequential order of the fabrication.
Figure 3B:
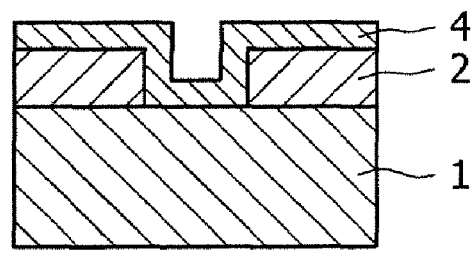
Figure 3C:
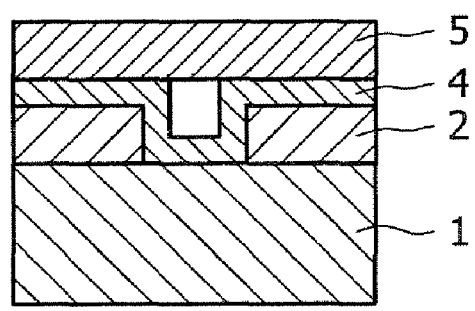

Next, a thin film of Cu-0.4 at % N alloy was formed on this test structure by sputtering in an atmosphere comprising a gas mixture of ($Ar+N_2$) ($Ar:N_2=97.5:2.5$), to thereby bridge of the via with the thin film of Cu-0.4 at % N alloy as shown in FIG. 3C. A structure was also prepared as a comparative example by forming a thin film of pure copper instead of the thin film of Cu-0.4 at % N alloy (Thickness of the film was 7500 angstrom in both cases).

Figure 3D:
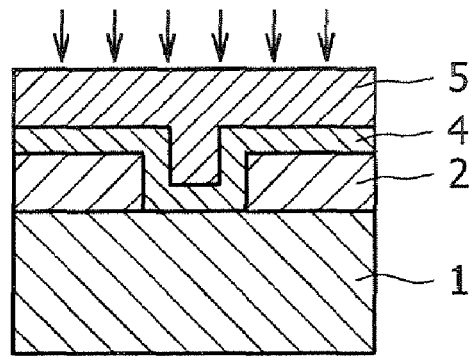

Next, the test structure having the via 3 covered by the bridging Cu based thin film 5 was subjected to a high temperature annealing process. More specifically, the high temperature annealing process was conducted using a high temperature annealing system "HiPA HIP mini-820" manufactured by Kobe Steel, Ltd. under the conditions of a pressure of 150 MPa, a keeping time of 15 min, and a temperature increase/decrease rate of 20° C./min by changing the temperature in the range of 400 to 600° C. as shown in FIG. 3D. Ar gas was used in the application of the high pressure (isostatic pressure).

Next, the test structure after the high temperature annealing process was worked on a FIB system (focused ion beam system) to expose cross section of at least 15 vias, and the via cross section was examined by SIM image of the FIB system to thereby evaluate the filling of the Cu based metal in the via (filling property).

To quantitatively evaluate the filling property of the Cu based metal, the SIM image of the via cross section was analyzed, and percentage of the cross sectional area filled with the pure copper or Cu—N alloy in the cross sectional area of the via (hereinafter sometimes simply referred to as "Cu filling ratio") was calculated. This Cu filling ratio was used for the index of the evaluation, and average of the Cu filling ratio for 15 vias found in the observation was determined.

Figure 4:
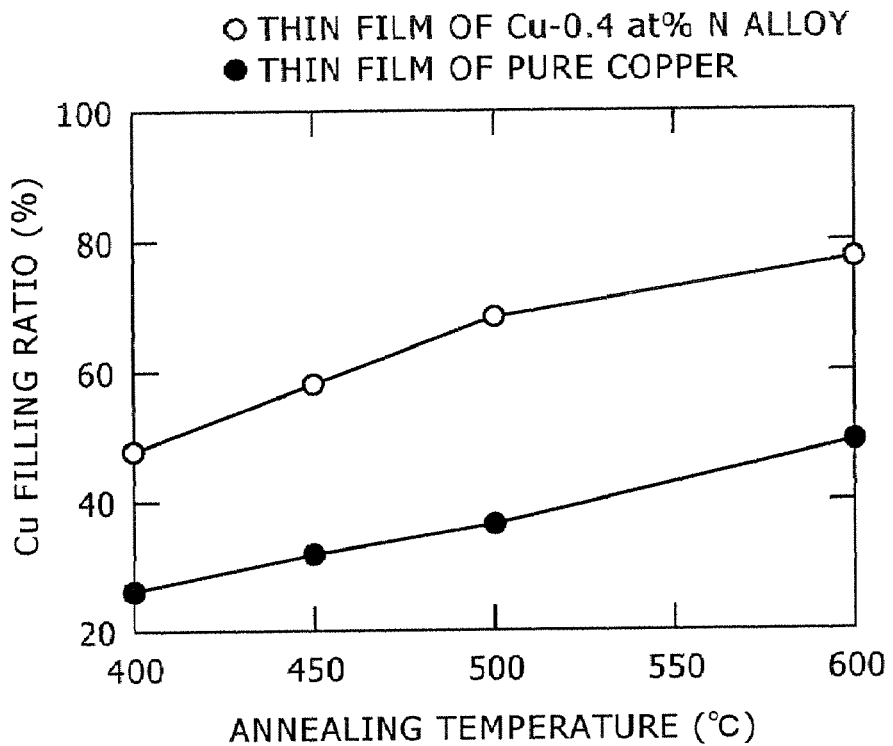
FIG. 4 is a graph showing Cu filling ratio in relation to the temperature of the high pressure annealing process in Example 2.

The results of the experiment are shown in FIG. 4 wherein the Cu filling ratio is shown in relation to the temperature of the high pressure annealing process. FIG. 4 demonstrates that, when a thin film of Cu—N alloy is formed (blank circle in FIG. 4), the Cu filling ratio increases with the increase in the temperature of the high pressure annealing process, and the vias are substantially filled to the filling ratio of 60% or higher when the high pressure annealing process is conducted at a temperature of 450° C. or higher. On the other hand, when a thin film of pure copper is formed instead of the Cu—N alloy thin film (solid circle in FIG. 4), the Cu filling ratio was inferior compared to the case of the structure having the Cu—N alloy thin film formed thereon.

Example 3

The procedure of Example 2 was repeated by forming a barrier layer (TaN thin film) having a thickness of 50 nm on the bottom and side of the via 3, and forming a thin film 5 of Cu-0.4 at % N alloy having a thickness of 7500 angstrom by sputtering to thereby completely bridge the via 3 with the thin film 5.

Next, the test structure was subjected to a high pressure annealing process by repeating the procedure of Example 2. The high pressure annealing process was conducted under the conditions of at a pressure of 150 MPa, a temperature of 400 to 600° C., a keeping time of 120 min., and a temperature increase/decrease rate of 20° C./min. Ar gas was used in the application of the high pressure (hydrostatic pressure).

The filling of the Cu based metal in the via (filling property) was then evaluated by repeating the procedure of Example 2.

Figure 5:
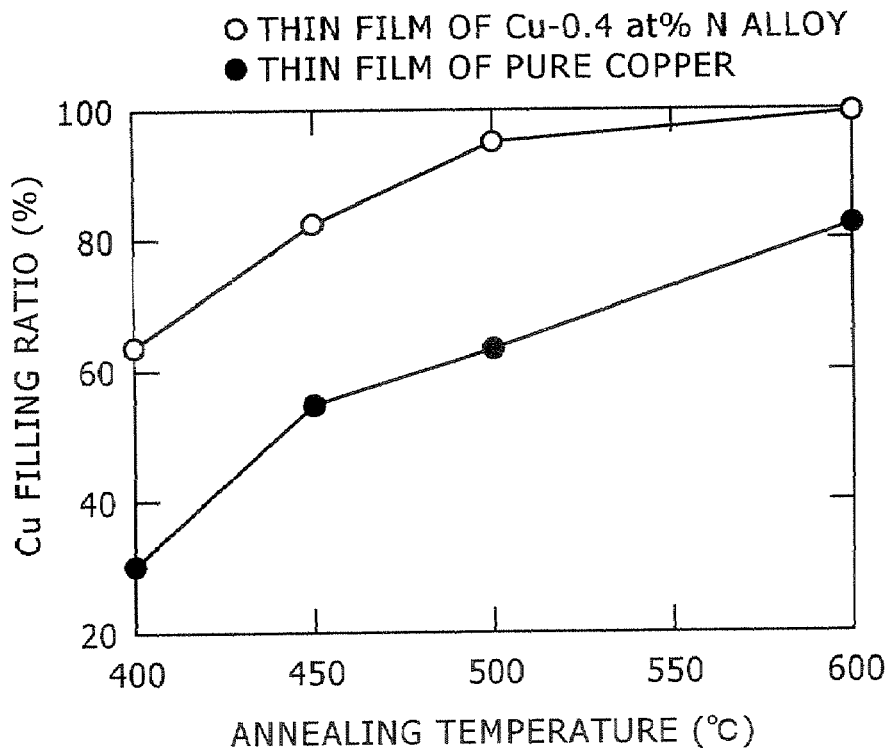
FIG. 5 is a graph showing Cu filling ratio in relation to the temperature of the high pressure annealing process in Example 3.

The results of the experiment are shown in FIG. 5 wherein the Cu filling ratio is shown in relation to the temperature of the high pressure annealing process. FIG. 5 shows that, when a thin film of Cu—N alloy is formed (blank circle in FIG. 5), the Cu filling ratio increases with the increase in the temperature of the high pressure annealing process, and the vias are substantially filled to 100% when the high pressure annealing process is conducted at a temperature of 500° C. or higher, indicating the excellent filling property. On the other hand, when a thin film of pure copper is formed instead of the Cu—N alloy thin film (solid circle in FIG. 5), the filling ratio was inferior compared to the case of the structure having the Cu—N alloy thin film formed thereon.

Example 4

The procedure of Example 2 was repeated except that the volume ratio of $N_2$ in the gas mixture of $(Ar+N_2)$ was changed. After forming a barrier layer (TaN thin film) having a thickness of 50 nm on the bottom and side of the via 3, a thin film of pure copper or Cu—N alloys having different nitrogen concentrations was formed to a thickness of 7500 angstrom by sputtering to thereby completely bridge the via 3 with the thin film 5.

Next, the test structure was subjected to a high temperature annealing process by repeating the procedure of Example 3 except that the high temperature annealing process was conducted at a constant temperature. More specifically, the high temperature annealing process was conducted under the conditions of a pressure of 150 MPa, a temperature of 500° C., a keeping time of 120 min, and a temperature increase/decrease rate of 20° C./min. Ar gas was used in the application of the high pressure (hydrostatic pressure).

The filling of the Cu based metal in the via (filling property) was evaluated by repeating the procedure of Example 2.

Figure 6:
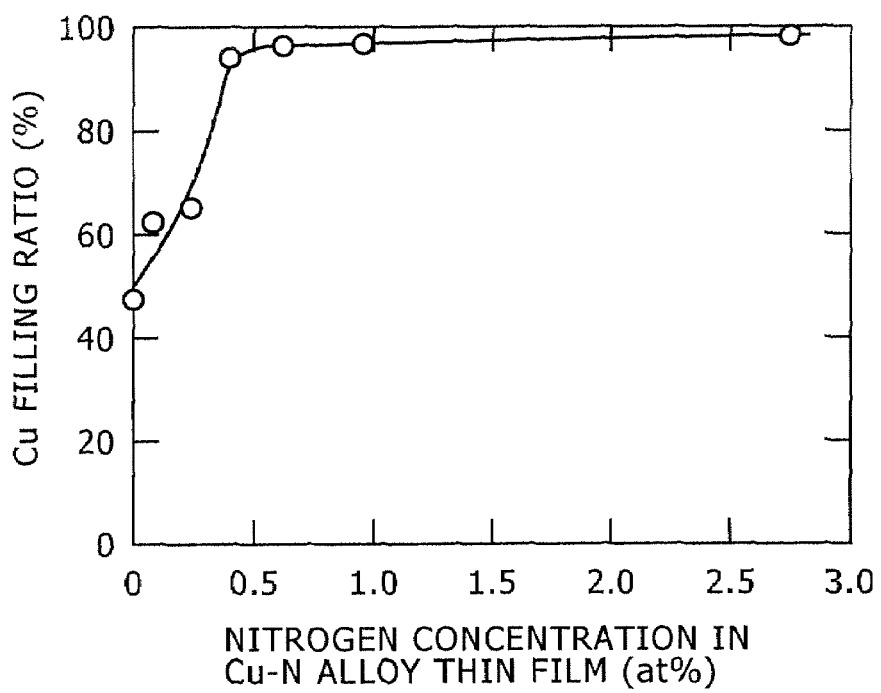
FIG. 6 is a graph showing Cu filling ratio in relation to the nitrogen concentration in the C-N alloy thin film in Example 4.

The results of the experiment are shown in FIG. 6 wherein the Cu filling ratio is shown in relation to the concentration of nitrogen in the Cu—N alloy thin film. FIG. 6 demonstrates that the Cu filling ratio in the via increases with the increase of the nitrogen concentration of the Cu—N alloy thin film, and the Cu filling ratio will be markedly higher than that of the pure copper thin film when the nitrogen concentration in the Cu—N alloy thin film is 0.4 at % or higher.

Example 5

The procedure of Example 1 was repeated to form a thin film of pure copper and thin films of Cu—N alloy having different nitrogen concentrations on a glass substrate having a diameter of 2 inches. The film thickness was 0.3 µm in all cases. The thin film was then annealed to 500° C. (heat treatment) to simulate the high pressure annealing process. Since the electric resistance is less likely to be affected by the pressure application, the heat treatment was conducted for 1 hour in a hot wall vacuum annealing furnace in the vacuum atmosphere of up to $1 \times 10^{-6}$ Torr.

The thin films were measured for their electric resistance immediately after the sputtering and the electric resistance after the heat treatment at 500° C. The electric resistance was measured by subjecting the thin film to photolithography and wet etching to thereby form a pattern of stripes having a width of 100 µm and a length of 10 mm, and measuring the electric resistance by 4 probe method using a prober at room temperature.

Figure 7:
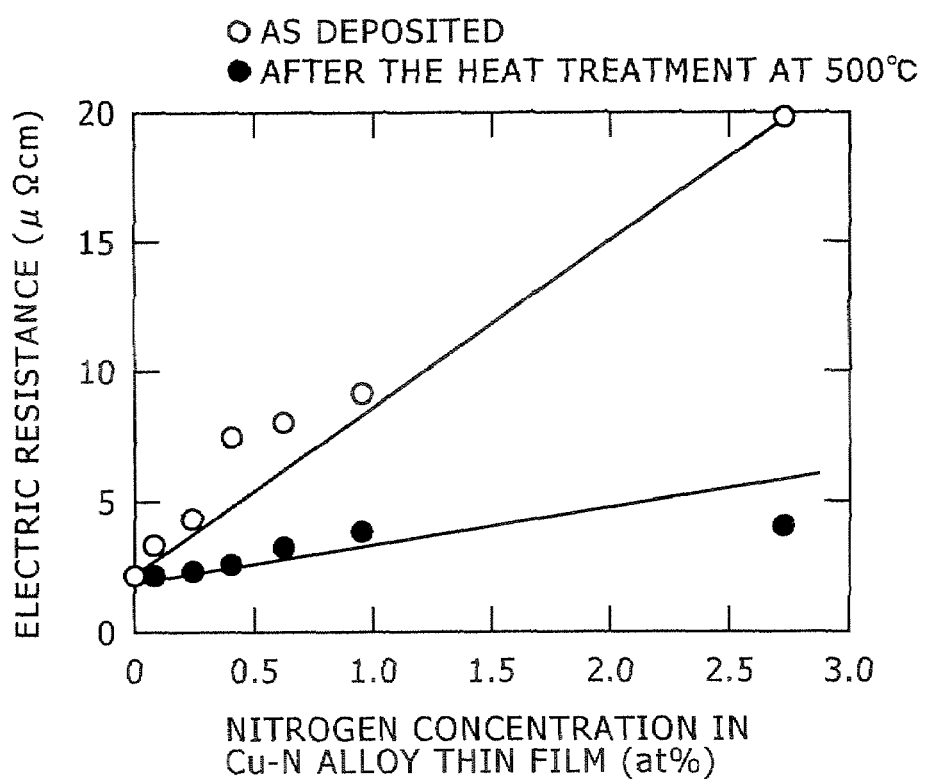
FIG. 7 is a graph showing electric resistance in relation to the nitrogen concentration in the C-N alloy thin film in Example 5.

The results of the experiment are shown in FIG. 7 wherein the electric resistance is shown in relation to the concentration of nitrogen in the Cu—N alloy thin film for both the electric resistance after the sputtering and before the heat treatment (namely, for the as-deposited state) and the electric resistance after the heat treatment at 500° C. FIG. 7 demonstrates that, although the electric resistance increases with the increase in the nitrogen concentration in the Cu—N alloy thin film, contribution of the nitrogen to the increase of the electric resistance is high in the as deposited state while the contribution of the nitrogen to the increase of the electric resistance reduces after the heat treatment at 500° C. and increase in the electric resistance is near zero. This indicates that the heat treatment can reduce increase of the electric resistance by the nitrogen.

Example 6

The procedure of Example 1 was repeated to form a thin film of Cu-0.4 at % N alloy on a glass substrate having a diameter of 2 inches. The film thickness was 0.3 µm. The thin film was then heated to different temperatures in the range of 400° C. to 600° C. (heat treatment) to simulate the high pressure annealing process. A structure with no heating was also prepared as a Comparative Example. Electric resistance was measured by repeating the procedure of Example 5.

Figure 8:
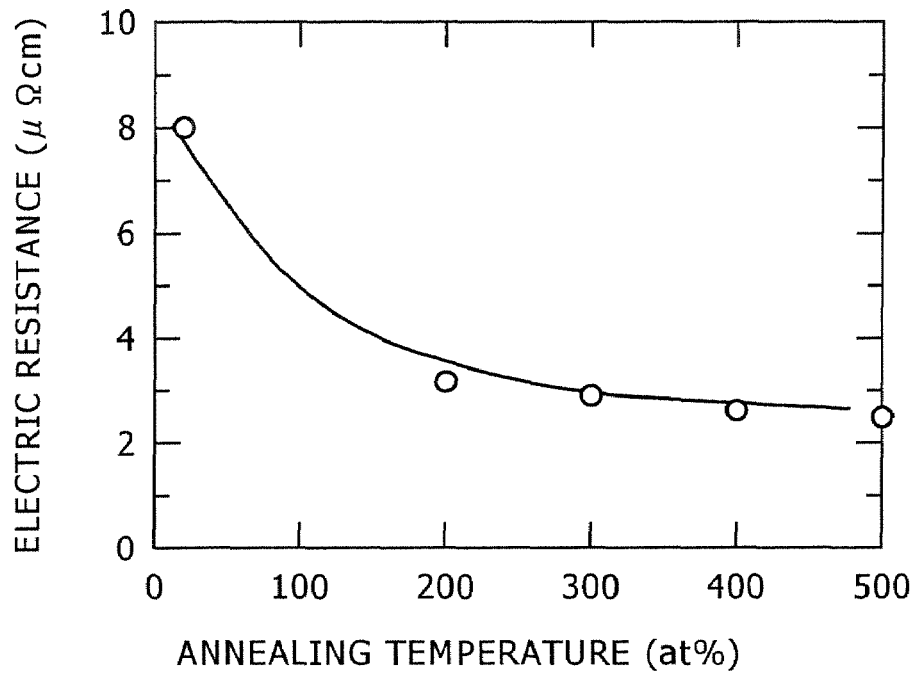
FIG. 8 is a graph showing electric resistance in relation to the temperature of the high pressure annealing process in Example 6.

The results of the experiment are shown in FIG. 8 wherein the electric resistance is shown in relation to the temperature of the heat treatment. (Note that the data for 20° C. is the structure without the heat treatment). FIG. 8 demonstrates that, while the as-deposited thin film of Cu-0.4 at % N alloy has a high electric resistance, the electric resistance can be reduced by subjecting the structure to a heat treatment. The decrease in the electric resistance, however, becomes slow at a temperature of 200° C. or higher, and the electric resistance becomes constant at about 2.5 µΩcm.

Example 7

A TaN thin film was formed to a thickness of 500 angstrom on a silicon wafer having a diameter of 2 inches by repeating the procedure of Example 2, and a thin film of a Cu—N alloy having different concentration of nitrogen concentration (8000 angstrom) was formed by repeating the procedure of Example 1. The thin film formed is a blanket thin film (a thin film with no processing such as patterning). Change in the stress of this laminate film was measured in situ by increasing and decreasing the temperature at a temperature increase/decrease rate of 5° C./min from room temperature to 500° C. to thereby depict a stress-temperature curve. The in-situ measurement of the stress was conducted by optical lever method.

Figure 9:
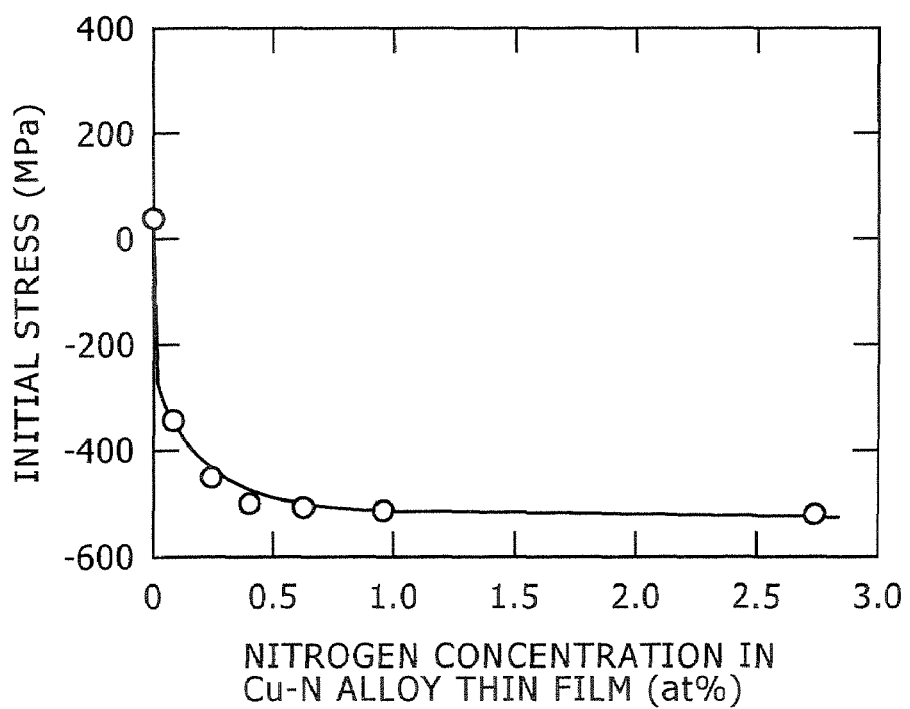
FIG. 9 is a graph showing the initial stress (residual stress in the as-deposited state) in relation to concentration of nitrogen in the Cu—N alloy thin film in Example 7.

The results of the experiment are shown in FIG. 9 wherein the initial stress (residual stress in the as-deposited state) is shown in relation to concentration of nitrogen in the Cu—N alloy thin film. FIG. 9 demonstrates that nitrogen addition to the copper thin film results in the rapid shift of the initial stress to the side of compression stress. While the value of the compression stress (absolute value of the stress) somewhat increases with the increase in the nitrogen concentration, the increase is saturated at the nitrogen concentration of 0.5 at % or higher, and the compression stress becomes constant at about –500 MPa.

Figure 10:
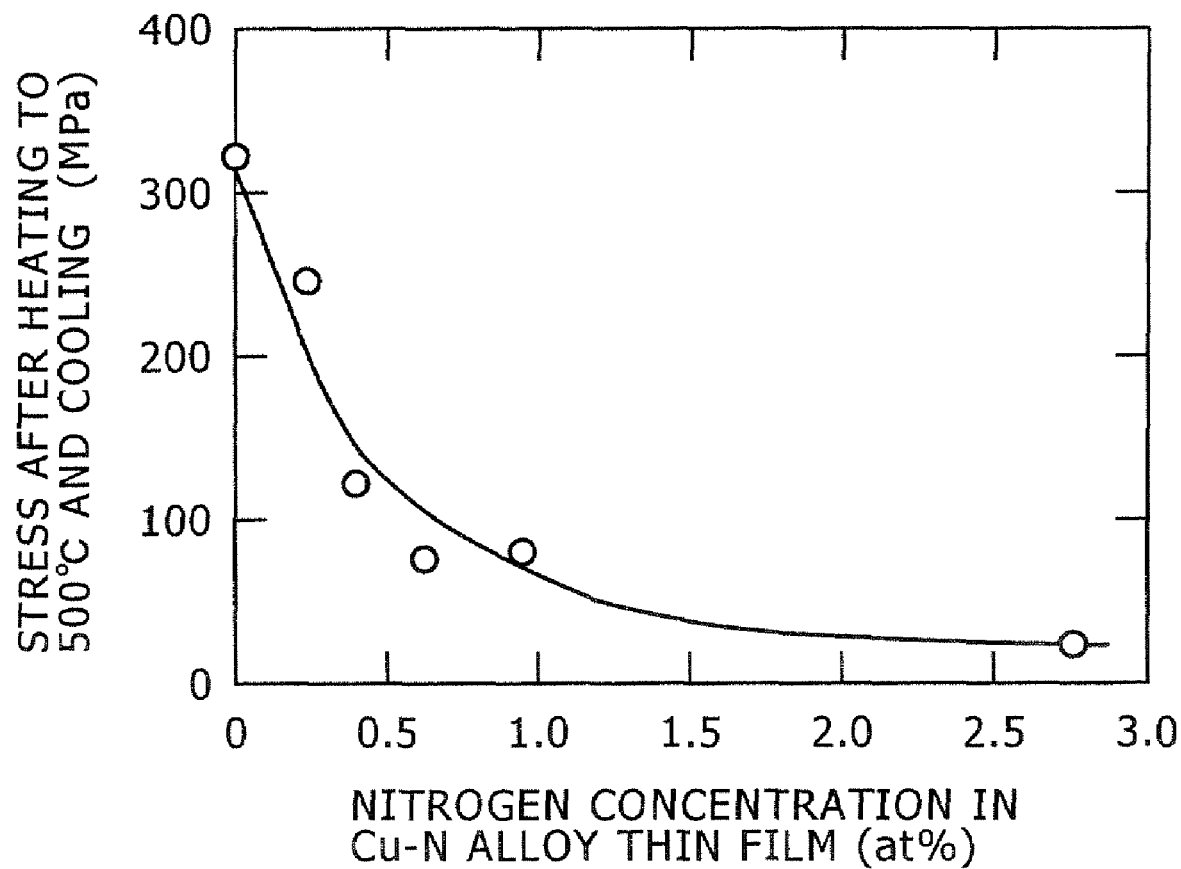
FIG. 10 is a graph showing stress after heating to 500° C. and cooling in relation to concentration of nitrogen in the Cu—N alloy thin film in Example 7.

FIG. 10 shows stress after heating to 500° C. and cooling (the stress at room temperature when the structure is heated to 500° C. and cooled to the room temperature) in relation to nitrogen concentration in the Cu—N alloy thin film. While the stress after heating to 500° C. and cooling is +300 MPa or higher in the case of the pure copper thin film (strong tensile stress remaining in the film), addition of nitrogen results in the decrease of the tensile stress after heating to 500° C. and cooling. The value of the tensile stress decreases with the increase in the nitrogen concentration, and the stress after heating to 500° C. and cooling is up to +200 MPa when the nitrogen concentration of the Cu—N alloy thin film is under the 0.4 at % or higher.

What is claimed is:

1. A metal thin film for use as an interconnection of a semiconductor device, wherein the metal thin film is used in fabricating a damascene interconnection of a semiconductor device by a high pressure annealing process, and the metal thin film comprises a Cu alloy containing consisting of Cu, N at a content of not less than 0.4 at % to not more than 2.0 at %, and optionally at least one element selected from the group consisting of Mg, Al, Si, P, S, Ti, V, Cr, Mn, Fe, Co, Ni, Zn, Ge, Y, Zr, Nb, Mo, Tc, Ru, Rh, Pd, Ag, Cd, In, Sn, Sb, Hf, Ta, W, Re, Os, Ir, Pt, Au, Pb, Bi, and a rare earth metal element (a lanthanoid series element of atomic number 57 to 71) wherein the total amount of said at least one element is 2.0 at % or less.

2. The metal thin film according to claim 1, wherein metal thin film exhibits a residual strength of –400 to –600 MPa.

3. An interconnection for a semiconductor device fabricated by forming the metal thin film of claim 1 or 2 over an insulator film which is formed over a semiconductor substrate and which has grooves formed therein; and filling the metal thin film in the interior of the grooves by a high pressure annealing process.

4. The interconnection for a semiconductor device according to claim 3, wherein the grooves are covered with a TaN film.

5. The interconnection for a semiconductor device according to claim 4, wherein the metal thin film exhibits a residual stress of 0 to +200 MPa.

6. The interconnection for a semiconductor device according to claim 3, wherein the metal thin film exhibits a residual stress of 0 to +200 MPa.

7. A method for fabricating the interconnection of a semiconductor device according to claim 3, wherein in the formation of the metal thin film over an insulator film which is formed over a semiconductor substrate and which has grooves formed therein and filling of the metal thin film in the interior of the groove, the high pressure annealing process is conducted under the conditions including a temperature of 200 to 650° C. and a pressure of 50 to 250 MPa.

8. The method according to claim 7, wherein the insulator film is the one having a groove whose surface is coated with TaN film.

9. The method according to claim 8, wherein the insulator film has a groove having a minimum width of not more than 0.15 µm and a depth of not less than 0.15 µm.

10. The A method for fabricating an interconnection of a semiconductor device according to claim 9, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film.

11. The method for fabricating an interconnection of a semiconductor device according to claim 9, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the metal thin film exhibits a residual stress of 0 to +200 MPa.

12. The method for fabricating an interconnection of a semiconductor device according to claim 9, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film and the metal thin film exhibits a residual stress of 0 to +200 MPa.

13. The method for fabricating an interconnection of a semiconductor device according to claim 8, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film.

14. The method for fabricating an interconnection of a semiconductor device according to claim 8, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the metal thin film exhibits a residual stress of 0 to +200 MPa.

15. The method for fabricating an interconnection of a semiconductor device according to claim 8, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film and the metal thin film exhibits a residual stress of 0 to +200 MPa.

16. The method according to claim 7, wherein the insulator film has a groove having a minimum width of not more than 0.15 μm and a depth of not less than 0.15 μm.

17. The A method for fabricating an interconnection of a semiconductor device according to claim 16, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film.

18. The method for fabricating an interconnection of a semiconductor device according to claim 16, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the metal thin film exhibits a residual stress of 0 to +200 MPa.

19. The method for fabricating an interconnection of a semiconductor device according to claim 16, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film and the metal thin film exhibits a residual stress of 0 to +200 MPa.

20. The method for fabricating an interconnection of a semiconductor device according to claim 7, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film.

21. The method for fabricating an interconnection of a semiconductor device according to claim 7, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the metal thin film exhibits a residual stress of 0 to +200 MPa.

22. The method for fabricating an interconnection of a semiconductor device according to claim 7, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film and the metal thin film exhibits a residual stress of 0 to +200 MPa.

23. A method for fabricating a metal thin film for uses as an interconnection of a semiconductor device, wherein the metal thin film of claim 1 or 2 is deposited by sputtering, and the sputtering gas used is a gas mixture of Ar and $N_2$ having a volume ratio (at 25° C., 1 atm) of Ar to $N_2$ of 97.5:2.5 to 82.5:17.5.

24. The method for fabricating an interconnection of a semiconductor device according to claim 23, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film.

25. The method for fabricating an interconnection of a semiconductor device according to claim 23, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the metal thin film exhibits a residual stress of 0 to +200 MPa.

26. The method for fabricating an interconnection of a semiconductor device according to claim 23, wherein the interconnection fabricated is an interconnection of a semiconductor device fabricated by forming the metal thin film over an insulator film which is formed over a semiconductor substrate and which has grooves formed therein, and filling the metal thin film in the interior of the grooves by a high pressure annealing process, and wherein the grooves are covered with a TaN film and the metal thin film exhibits a residual stress of 0 to +200 MPa.

* * * * *